United States Patent [19]
Osmon

[11] Patent Number: 5,933,608
[45] Date of Patent: *Aug. 3, 1999

[54] MULTIWAY SIGNAL SWITCHING DEVICE INCLUDING A WSIC AND OPTICAL COMMUNICATION PORTS

[75] Inventor: Peter Edwin Osmon, London, United Kingdom

[73] Assignee: The City University, London, United Kingdom

[*] Notice: This patent issued on a continued prosecution application filed under 37 CFR 1.53(d), and is subject to the twenty year patent term provisions of 35 U.S.C. 154(a)(2).

[21] Appl. No.: 08/162,105
[22] PCT Filed: Jun. 15, 1992
[86] PCT No.: PCT/GB92/01070
  § 371 Date: Dec. 10, 1993
  § 102(e) Date: Dec. 10, 1993
[87] PCT Pub. No.: WO92/22904
  PCT Pub. Date: Dec. 23, 1992

Related U.S. Application Data

[63] Continuation-in-part of application No. 07/548,979, Jul. 31, 1990, Pat. No. 5,287,345.

[30] Foreign Application Priority Data

| Feb. 4, 1988 | [GB] | United Kingdom | 8802447 |
| Sep. 28, 1988 | [GB] | United Kingdom | 8822785 |
| Jun. 13, 1991 | [GB] | United Kingdom | 9112776 |

[51] Int. Cl.⁶ .............. G06F 13/38; G06F 15/17
[52] U.S. Cl. ............... 395/200.73; 395/200.68; 359/117
[58] Field of Search ............... 395/200, DIG. 1, 395/800, 200.68, 200.69, 200.73; 370/60; 359/115, 117, 163, 172

[56] References Cited

U.S. PATENT DOCUMENTS

| 3,486,029 | 12/1969 | Barrett et al. | 359/163 |
| 4,063,083 | 12/1977 | Cathey et al. | 359/163 |
| 4,290,146 | 9/1981 | Adolfsson et al. | 359/115 |
| 4,393,515 | 7/1983 | De Neumann | 359/172 |
| 4,733,093 | 3/1988 | Graves et al. | 359/163 |
| 4,809,358 | 2/1989 | Fernström | 359/163 |

(List continued on next page.)

FOREIGN PATENT DOCUMENTS

| WO 87/05724 | of 1987 | European Pat. Off. . |
| 0 019 234 | of 1988 | European Pat. Off. . |
| WO 89/07298 | of 1989 | European Pat. Off. . |
| 0 416 714 A2 | of 1991 | European Pat. Off. . |
| 59-103166 | of 1984 | Japan . |
| 62-179041 | of 1987 | Japan . |
| WO 86/04701 | 8/1986 | WIPO . |

OTHER PUBLICATIONS

Patent Abstract of Japan, vol. 8, No. 219, Oct. 5, 1984, JP,A,59 103166 (Fujitsu) Jun. 14, 1984.
Patent Abstract of Japan No. 62–179041, Aug. 6, 1987.

(List continued on next page.)

*Primary Examiner*—Mark H. Rinehart
*Attorney, Agent, or Firm*—Nixon & Vanderhye P.C.

[57] ABSTRACT

A wafer scale integrated circuit device includes a plurality of circuit cells formed in a common substrate, a plurality of communication paths between circuit cells, a plurality of switches, coupled to the communication paths, for interconnecting a first path and a selected second path, a plurality of communication ports, at least a first being arranged to receive an external signal and at least a second being arranged to transmit an external signal, and a control for controlling the switch to open a circuit path from a first port through said wafer and to a selected second port different to the first to provide a switched communications link.

32 Claims, 13 Drawing Sheets

U.S. PATENT DOCUMENTS

| | | |
|---|---|---|
| 4,826,272 | 5/1989 | Pimpinella et al. . |
| 4,850,044 | 7/1989 | Block et al. ............................. 359/163 |
| 4,937,659 | 6/1990 | Chall, Jr. . |
| 5,040,168 | 8/1991 | Maue et al. ............................. 359/115 |
| 5,237,441 | 8/1993 | Nhu ........................................ 359/163 |
| 5,247,593 | 9/1993 | Lin et al. ................................. 385/17 |
| 5,268,973 | 12/1993 | Jenevein ................................... 385/74 |
| 5,287,345 | 2/1994 | Osmon et al. ............................ 370/60 |
| 5,335,361 | 8/1994 | Ghaem .................................... 359/163 |
| 5,392,148 | 2/1995 | Takahashi et al. ..................... 359/172 |
| 5,493,437 | 2/1996 | Lebby et al. ............................ 359/163 |

OTHER PUBLICATIONS

Patent Abstract of Japan No. 62–179042, Aug. 6, 1987.

Patent Abstract of Japan No. 62–179043, Aug. 6, 1987.

Patent Abstracts of Japan, vol. 12, No. 25 (P–659) (2872) Jan. 26, 1988.

FTCS 19 Digest of Papers; The 19th International Symposium et al, Jun. 20–23 1989, Chicago pp. 93–100 Kung & Song 'Comprehensive Evaluation et al'.

International Journal of Electronics, vol. 69, No. 5, Nov. 1990, London, GB pp. 665–671, Choi 'Design of Self–Testable Wafer–Scale Processor Arrays'.

IEEE Journal of Solid–State Circuits vol., 26, No. 5, May 1991, New York pp. 717–726, Change & Fuchs 'Loop–Based Design and Reconfiguration et al'.

Computer Communication Review vol. 18, No. 4, Aug. 1988, New York, pp. 25–34 Karol 'Optical Interconnection Using Shufflenet Multihop Networks in et al'.

"Universal Switching Network: Application to a WSI SIMD Array" Wafer Scale Intergtion, 199 Int'l Conf, Boubekeur et al.

"Channel Complexity analysis for reconfigurable VLSI/WSI Proc", Application Specific Array Processors, 1990 Int'l Conf, Rhee et al.

MULTIWAY SIGNAL SWITCHING DEVICE INCLUDING A WSIC AND OPTICAL COMMUNICATION PORTS

RELATED APPLICATION

This application is a continuation of my earlier co-pending application number PCT/GB 92/01070 filed 15 Jun. 1992 designating the United States (and amended on 13 Apr. 1993 and 5 May 1993), now abandoned without prejudice in favor of the present US application. which is a continuation-in-part of my earlier filed copending application Ser. No. 548,979 filed Jul. 31, 1990 for DATA HANDLING ARRAYS now issued as U.S. Pat. No. 5,287,345.

BACKGROUND OF THE INVENTION

1. Field of the Invention

This invention relates to memory devices incorporated in wafer scale integrated circuits.

2. Related Art

In integrated circuit fabrication, a single crystal is generally formed and then sliced into wafers. Each wafer is then processed using conventional fabrication techniques to form an array of identical integrated circuits, and the array is then cut into pieces on each of which is one of the integrated circuits.

Because of the variability of fabrication techniques, the yield of working integrated circuits rarely approaches 100%. After testing, circuits which do not work are not used.

Recently, interest has grown in wafer scale circuits; that is, integrated circuits which make up the whole or a substantial part of the area of a wafer. A very large number of circuit components can be manufactured on a wafer, with the connections between the components provided in the fabrication process so that the distance between adjacent components is small and communications between components on the wafer are fast. However, parts of the wafer will almost certainly be defective, and the defects will vary from wafer to wafer. It is therefore necessary for wafer scale circuits to be tolerant of such defects if they are to be usable. For this reason, to date, only very limited use has been made of wafer scale circuits.

One strategy for providing fault tolerant wafer scale circuits, as discussed in our earlier International application no. WO89/07298, is to provide that the circuit comprises an array of a large number of similar components interconnected by a communications network, and to carry out a test to determine which of the components and which parts of the network are not working. WO83/02019 proposes a wafer device comprising a plurality of cells (which can be memory cells) which are tested to establish their operating condition.

It has also been proposed to utilise wafer scale integrated circuits to provide an array of data processors on a large scale, to deal with parallel processing algorithms. Our above referenced application describes one approach, and another is described in "An Interconnection Scheme for a Tightly Coupled Massively Parallel Computer Network", J D Harris and A G T Connell, Proc IEEE International Conference on computer design: VLSI in computers, ICCD'85, PP612–616.

The prior art generally employs packet switching techniques in which messages are transmitted in separate packets.

SUMMARY OF THE INVENTION

We have realised, however, that a wafer scale integrated circuit can provide a high capacity, high speed communications switch. We have realised that the high bandwidth communications achievable internally within a wafer scale device can be used to provide a high capacity switch for interconnecting optical fibers, which have a similarly high bandwidth. Accordingly, in one aspect of the invention we provide a wafer scale circuit switching between a plurality of optical communications channels (preferably optical fibre channels).

A preferred embodiment of the invention comprises a plurality of such wafer scale integrated circuits, with optical communication channels disposed between the input ports of one circuit and the output ports of another. The input ports comprise opto-electrical transducers and the output ports comprise electro-optical transducers. Preferably, the optical communications channels comprise optical waveguides, for example optical fibres, disposed between the ports.

In another aspect, the invention provides a multi processor apparatus for data processing which comprises a plurality of processor units coupled to input and output ports of a wafer scale integrated circuit comprising a memory device, so that each can read data or write data through the memory device. Preferably, in this aspect, the memory device comprises a plurality of wafer scale integrated circuits as above.

Preferably, the invention performs circuit switching; in other words, opens and holds open a path through the wafer circuit through which messages can pass.

BRIEF DESCRIPTION OF THE DRAWINGS

Other aspects and embodiments are as described or claimed hereafter, with advantages which will be apparent from the following.

The invention will now be described, by way of example only, with reference to the accompanying drawings in which:

FIG. 3b shows schematically the logical arrangement of a cell of FIG. 3a;

FIG. 4 shows in greater detail a portion of FIG. 3a;

DETAILED DESCRIPTION OF EXEMPLARY EMBODIMENTS

Wafer Scale Circuit

Figure 1:
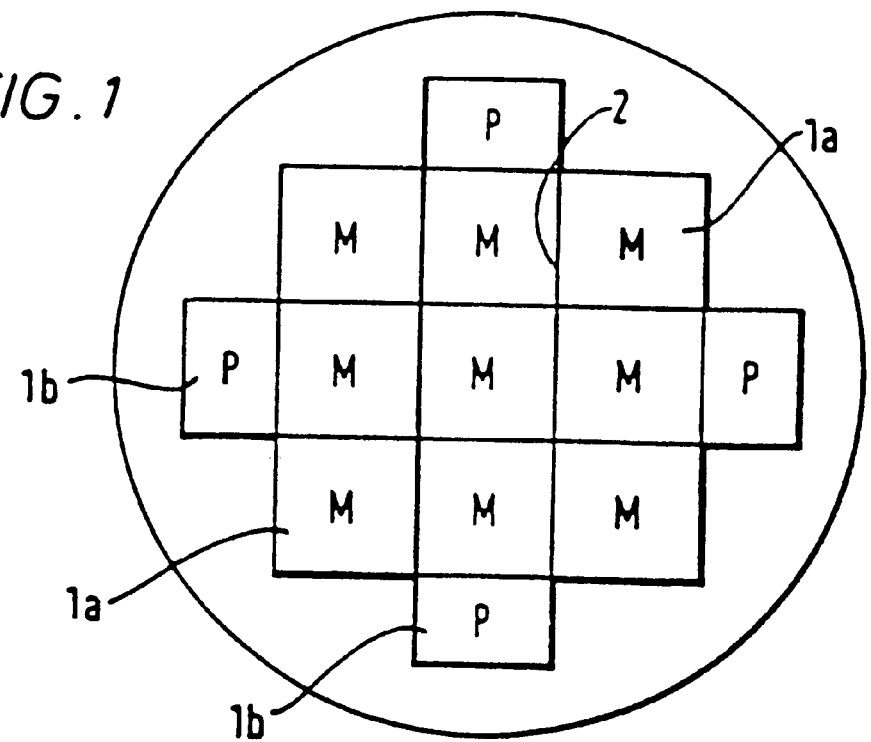
FIG. 1 shows schematically a wafer scale integrated circuit according to an embodiment of the invention.
Figure 2:
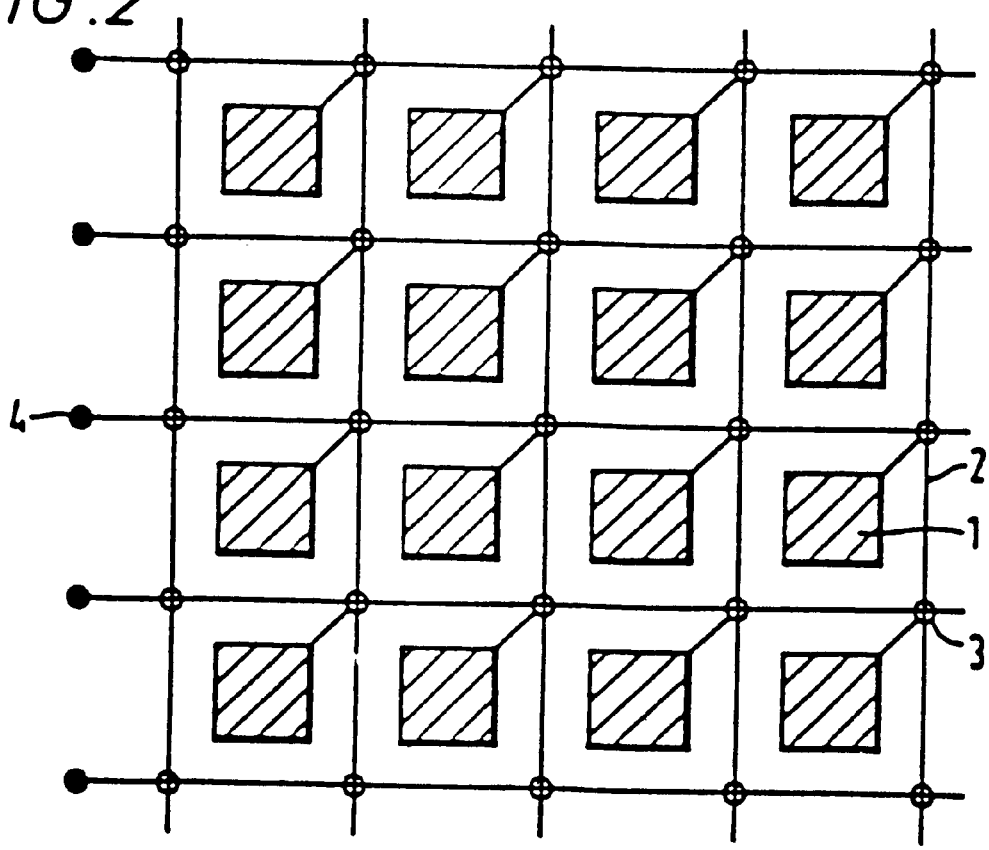
FIG. 2 shows schematically the logical arrangement of elements of the circuit according to this embodiment.

Referring to FIG. 1, a wafer scale integrated circuit comprises a regular tessellated array of memory cells 1a (for example 16–256 cells) each fabricated as, for example, dynamic random access memory (DRAM) of any convenient size (e.g. each as several modules of on the order of 1Mbyte capacity), and a plurality of communication paths 2 (each preferably a parallel path comprising a plurality of bit paths, for example, 128 separate bit paths) between the blocks. Each memory module may correspond to a commercially manufactured RAM chip, including conventional address circuitry. Data is read from and written to memory typically in blocks of, for example, 1Kbyte and each memory module therefore comprises a plurality of segments dimensioned to hold a block, at different addresses. Referring to FIG. 2, schematically the device comprises also a plurality of switches 3 each switch interconnecting the communications paths 2 with each other and with one of the cells 1, and a number of input/output connection ports 4 (for example 4–16 ports). Each port is connected to the device at a port cell 1b.

Common power and clock lines (not shown) are provided to all cells of the wafer.

Typically, some of the memory modules 1 and/or communication paths 2 do not function. For a signal to pass between one of the memory units (for example the bottom right hand memory unit of FIG. 2) and one of the input/output ports (for example the top left hand port), a path along the communication paths 2 through the switches 3 must be followed. It will immediately be seen that a large number of different paths could be followed, of varying degrees of directness. The access time (latency) for reading or writing data to a memory unit 1 is related to the length of the path between the source or destination of the data and the memory unit. However, it will not always be possible for data to follow the most direct route along the communication paths 2, since many of these may not be working.

Our above referenced earlier application describes wafer scale integrated circuits in which each of the switches 3 includes a table indicating which of its neighbours is working. In this embodiment of the present invention, however, each switch 3 is responsive to the incoming signal to connect the incoming signal to one of the communication paths 2 to which the switch is connectable (in the manner of a telecommunications crossbar switch).

Thus, an incoming message selectively moves through the communications paths 2, at each stage opening another switch 3 to open a communications circuit. The communications circuit may terminate at a memory unit 1, or run from an input port 4 to an output port 4.

In general, each signal that passes through the wafer scale integrated circuit may be bidirectional; for example, a first signal may be transmitted to a block of memory 1, and an acknowledgement signal transmitted back. This process may occur when data is written to a block of memory 1. Alternatively, the signal sent to the block of memory 1 may be an interrogation signal, and the block of memory 1 may reply by transmitting a requested stored signal back to the origin of the request.

Figure 3A:
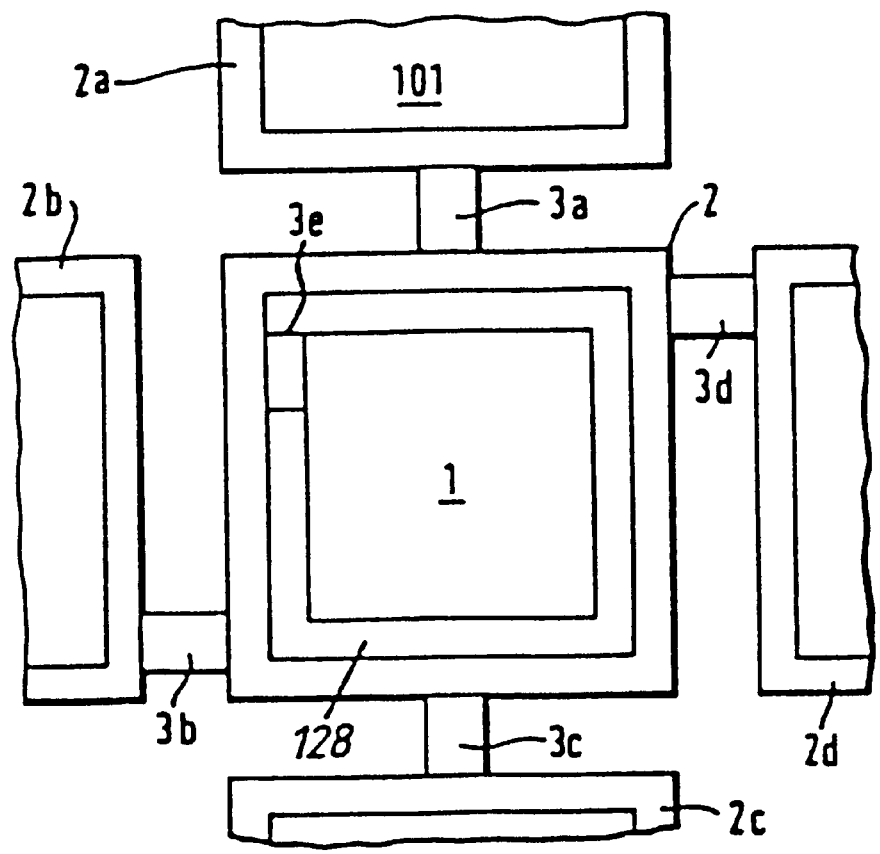
FIG. 3a shows a detail of the path arrangement of cells of the wafer scale integrated circuit.
Figure 3B:
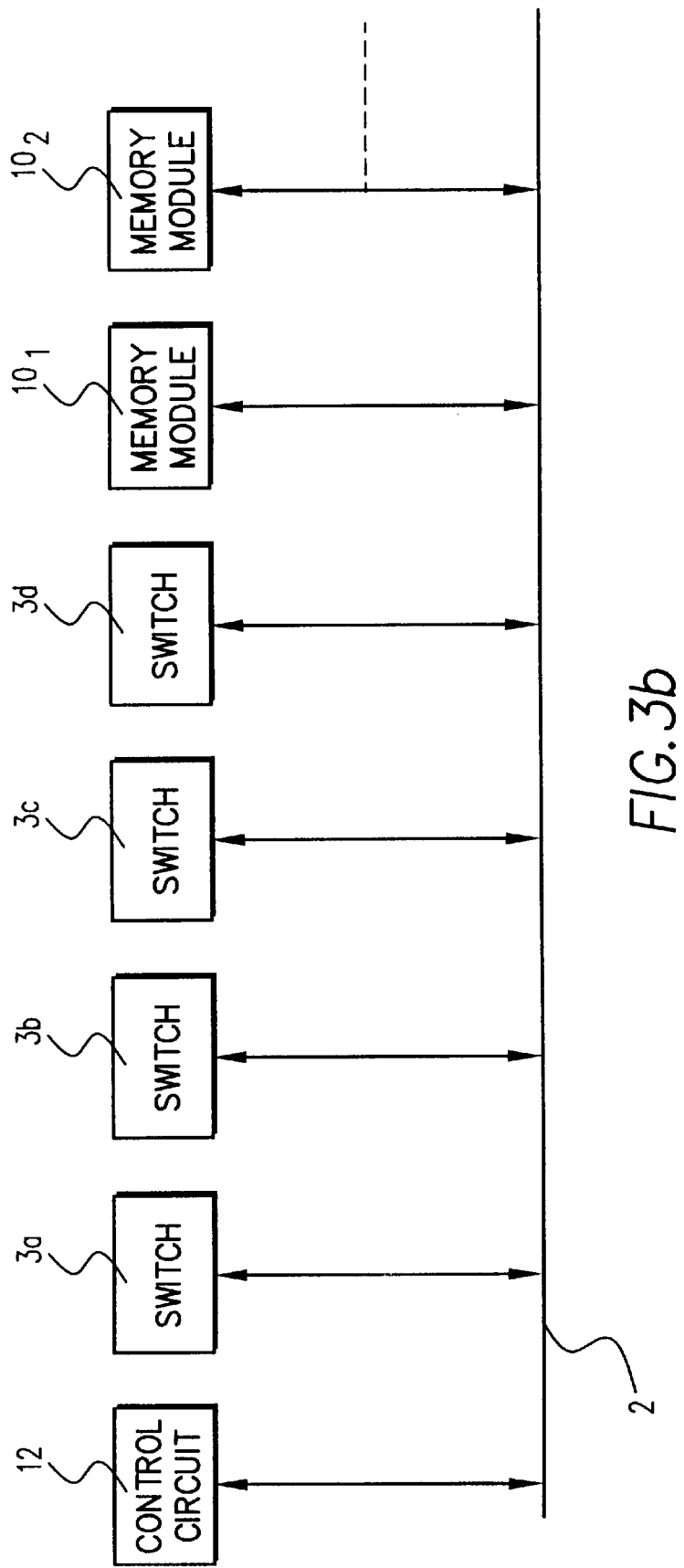

Referring to FIG. 3a, the physical arrangement of cells of the array of FIG. 1 is shown. Each cell includes a communication path comprising a parallel (preferably highly parallel, eg. 64 or 128 bit wide) data bus surrounding the cell. Referring to FIG. 3b, the logical arrangement of a cell is shown. The bus 2 of the cell 1 is interconnectable to any of the four surrounding buses 2a–2d of neighbouring cells via a respective switch 3a–3d, each switch comprising a bank of bit connections for connecting corresponding bit lines of the buses. The bus 2 is also connected to the memory modules $10_n$ within the cell. Each memory module includes conventional addressing and control logic. The cell 1 also includes, for controlling the switches 3a–3e, a control circuit 12, which comprises means for sensing the state of the incoming signal (for example, two bits of the incoming signal) on each of the four communication paths 2a–2d, and for switching in one of the switches 3a–3d making up the switch 3 to interconnect the communication path on which the sensed data arrived with another communication path the identity of which is indicated by the sensed data. For example, for square cells, if two bits are sensed, this is sufficient to select any of the four communication paths 2a–2d of surrounding cells, each of which corresponds to a predetermined bit combination on the two sensed input lines.

Three of the possible two bit combinations (e.g. 01, 10, 11) may be used to select one of the registers other than that on which the message arrived (for example, by selecting the steps clockwise or anticlockwise round the cell from the register on which the message arrived), and the fourth code (e.g. 00) may provide an indication that the message is intended to cause a local action at the cell. The local action taken is selected depending on the value of the next data in the message; for example, a first local action is to write the following data block to memory, a second is to read memory out through the open circuit to the port, and a third may be to route the received message back through the same route to the port (for reasons to be discussed later).

Figure 4:
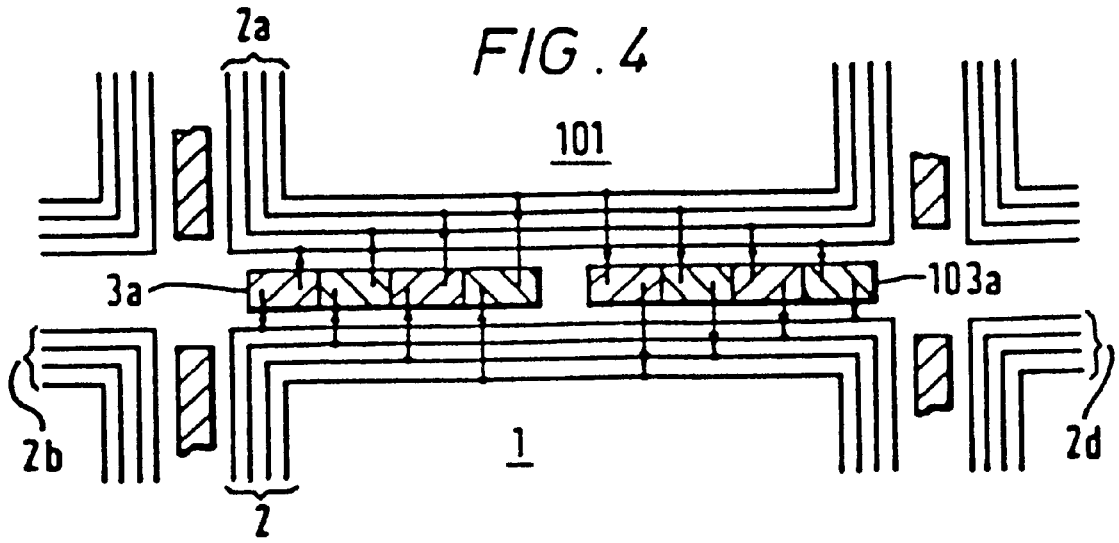

Referring to FIG. 4, the interconnection between two adjacent cells 1, 101 of FIG. 3a is shown in greater detail. The switch 3a for connecting the bus 2 to the bus 2a comprises a parallel in parallel out register circuit, selected by a control line (not shown) from the control circuit 12. A corresponding register 103a is controlled by the control circuit 112 (not shown) of the cell 101. Thus, the cell 1 can open a circuit connection between its bus 2 and that 2a of its neighbour 101. When a further cell is also connected to the bus 2, the bus 2 and switch 3a act as a link between the two neighbouring cells.

The arrangement of FIG. 3a and FIG. 4 provides short buses around the periphery of each cell 1, interconnected by registers between the buses; this structure is easy to provide in a regular array and permits wide parallel buses and fast interconnection through the registers.

Associated with each bus 2 are input and output handshaking ("message clocking") lines, switchably interconnectable at each switch 3. The controller 12 of each cell examines the state of the input handshaking line and may move a message word into an output register 3a–3d in response to a handshake signal thereon. After doing so, it generates a handshaking signal on the output handshaking line to the preceding cell along the route, which correspondingly clocks the next message word forwards, and again propagates the handshake signal backwards. The whole message therefore advances one word forward through the wafer. Thus, at a given stage, the message extends across the wafer and is held as individual words in the registers of the cells along the path taken by the message. Once the communication circuit is set up, it therefore functions rather like a shift register, shifting parallel words from the port to the destination.

Details of a similar arrangement for communication which could also be used are given in Technical Report TCU/CS/91/23, "MESHNET Multistage communications network" available from the present applicants, The City University, Northampton Square, London.

If the message reaches a blockage point, because a register through which the message is routed is already acting as a link for another message, no handshaking signals are generated and the message remains static. This could result in blockage of further subsequent messages, and hence in a preferred embodiment means are provided for cancelling the blocked circuit. For example, a signal propagated back along the handshake line from the blockage may cause successive cells to disconnect their registers, dissolving the circuit. The same action may be taken when a message successfully reaches its destination. Thus, extended blockages cause the message to be lost. To avoid irreversible loss of data, in this embodiment, each port retains the message in local memory until the message has reached its destination (for example, by monitoring line handshaking).

Since a link is established by linking the cell bus 2 with one of the output registers 3a–3d, even when a cell is acting as a link in a message circuit it can also act to link another of the registers with the bus and hence act as a link in another crossing circuit by clocking the contents of the bus 2 at different timings under the control of the handshaking lines. Likewise, a forward message and a return message can proceed at the same time between a port and a cell by clocking the handshaking lines at different timings.

Figure 5A:
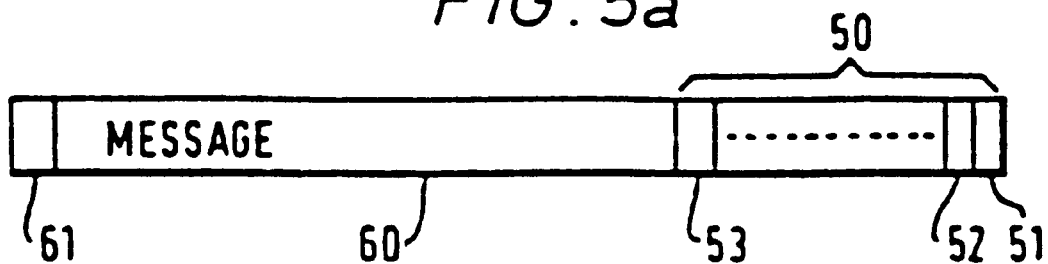
FIG. 5a shows the format of a message communicating within the embodiment of FIG. 1.

Referring to FIG. 5a, the structure of a message arriving at the path 2 in one embodiment is shown. The message comprises a routing header portion 50 comprising a succession of parallel words 51,52 . . . , immediately following which is a header end flag corresponding to the "local" action 2 bit value (e.g. 00) 53, followed by the words making up the message portion 60. Both the header portion and the message can be of variable length. Following the message is a tail flag 61 indicating the end of a message.

Figure 12:
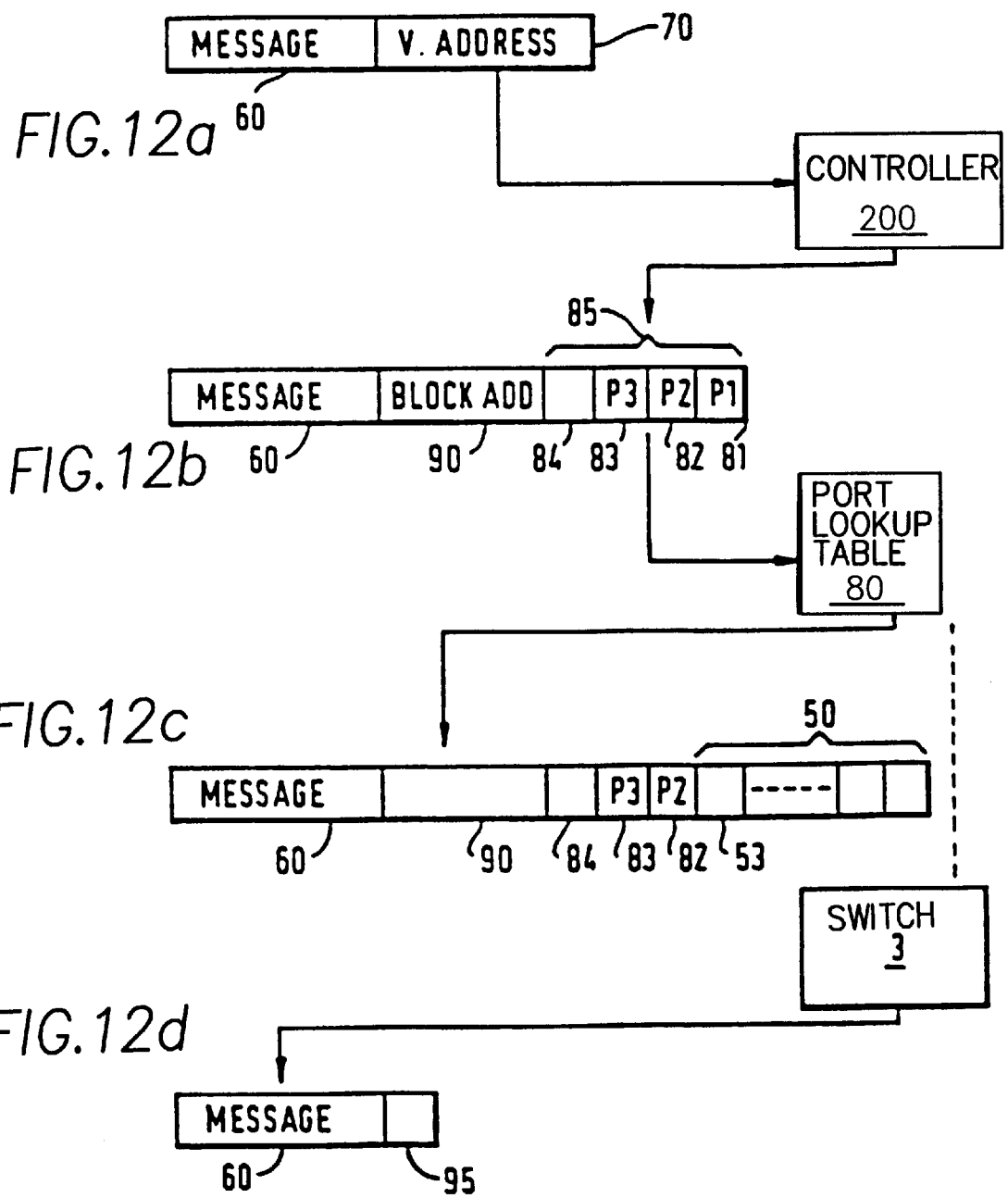
FIG. 12a–d shows schematically the progress of a message through the device of FIG. 9.

Each message portion 60 may comprise an address or addresses 95 (e.g., see FIG. 12) of memory within the cell 1, and data to be written to that address or addresses.

The operation of the switch 3 will now be described. The switches are normally closed, so that the paths 2, 2a–2d are not interconnected. When a word is applied to the bus 2 from a switch of neighbouring one of the communication paths 2a–2d, the control circuit 12 delays one communication clock period, until the next word has appeared at the communication path, and then opens the bank of switches 3a, 3b, 3c or 3d which interconnect the communication path at which the signal is received and the path 2a, 2b 2c or 2d indicated by the preceding word. The first word 51 to reach the switch 3 is therefore lost, and the following words 52–61 proceed through the cell and on to the next switch.

Thus, at each cell and switch 3 reached, one word of the header portion is removed from the header portion 50, until the "end of header" flag 53 is reached. Each switch 3 also includes a switch 3e to connect the bus 2 to the block of memory 10 of the cell 1, and the control circuit 12 is arranged to operate the switch 3e to switch data through to the block of memory 1 when it detects the "end of header" word 53, and to take local action to read or write depending on the following words.

It will thus be seen that each word 51,52 . . . 53 in the header portion sets the state of a switch 3 encountered in sequence as the message passes through the wafer scale circuit. The header portion of the message before it enters the wafer scale circuit therefore specifies the path through the circuit which the message takes.

If the circuit includes a plurality of input/output ports 4, and the message includes a header portion which leads the message to one of the ports, from another of the ports, the series of switches 3 set during the passage of the header portion of the message defines a route through the wafer scale circuit and out again through a selected one of several ports. Thus, the wafer scale circuit is acting as a selector switch which is selectively able to set up a circuit through the wafer scale component between two ports, the identity of the second port being selected by the message applied at the first. Because the communication paths on the chip are fast, and because the paths can be made massively parallel, the data transfer rate across the chip is fast.

Figure 6:
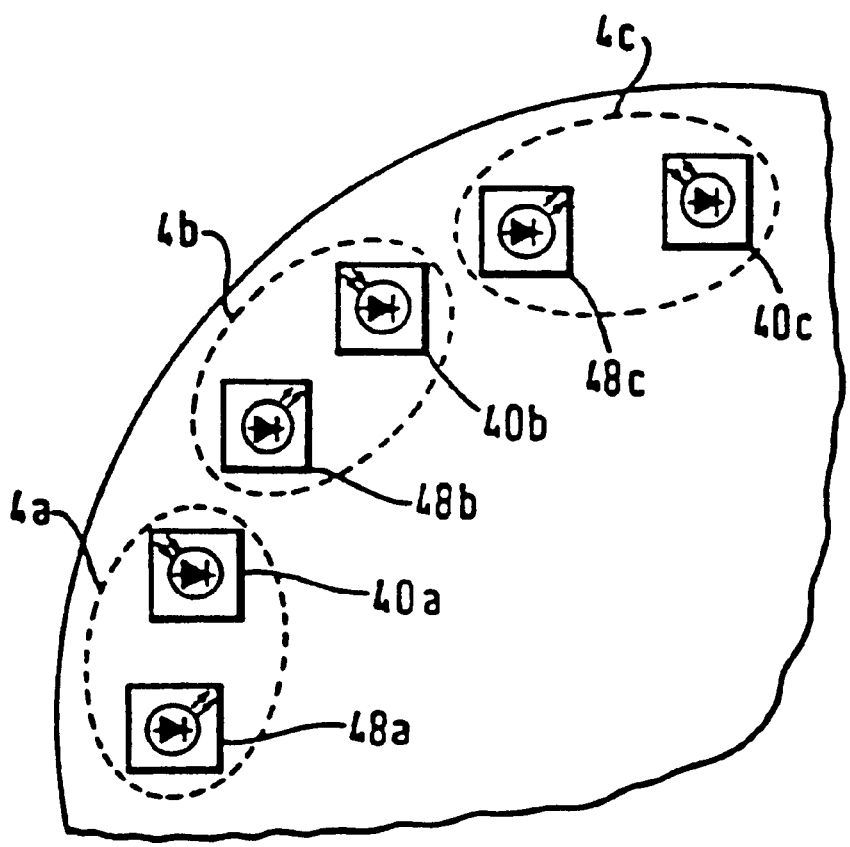
FIG. 6 shows in greater detail a portion of FIG. 1.
Figure 7:
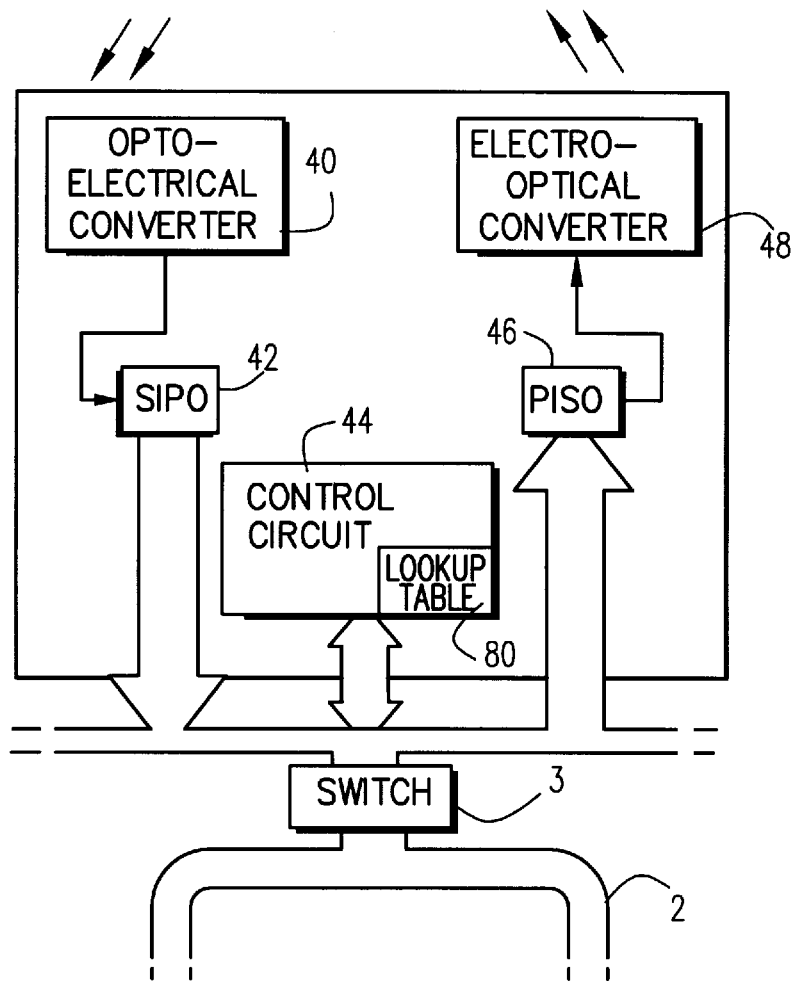
FIG. 7 shows schematically the physical arrangement of a port forming part of FIG. 6.

Referring now to FIGS. 6 and 7, the structure of a port 4 in this embodiment will now be described. Each port 4a–4c comprises an opto-electrical converter 40 (for example a GaAs photodiode) coupled to an input optical communication channel. The output of the opto-electrical converter 40 comprises a serial stream of bits which are assembled in a serial to parallel converter and buffer 42 into parallel words which are buffered.

Typically, the stream of bits are enclosed in a code (e.g. Manchester encoding) allowing the bit clock to be recovered and the converter 42 includes a clock recovery stage decoding the signal and clocking the bits in accordance with the recovered clock.

The port 4 also comprises an output port section comprising an electro-optical converter 48 which may comprise, for example, a GaAs laser diode, arranged to supply a sequence of optical pulses to an optical communication channel. The electro-optical converter 48 is coupled to a parallel to serial converter 46, connected to the communication path 2. Typically, the output signal is encoded in a clock recovery code (e.g. Manchester encoded) in the converter 46.

Incoming words to the port are thus serial converted and transmitted through the optical channel.

A control circuit 44 at the port comprises a lookup table 80 receiving a word supplied from the serial to parallel converter indicating an address on the wafer (either a port code indicating another port on the wafer or a block address 90 indicating a memory segment on the wafer), and outputting in response a header portion 50 setting a route through the wafer to the desired address; it may also output a cell address portion 95 setting the memory segment address within the destination cell. The header portion 50 is terminated by an "end of header" code 53 in each case. The header portion is supplied from the control circuit 44 to the communication path 2 of an adjacent cell; the first word of the header portion sets the position of the switch 3, and subsequent words of the header portion are then routed through the switch. After the end of header word, the received message 60 is supplied, word by word, to the communication path 2 from the buffer 42.

The port cell preferably includes several memory modules, for example identical to those in each memory cell 1a, to be used by the port as a buffer for messages until they have reached their destination.

Figure 8:
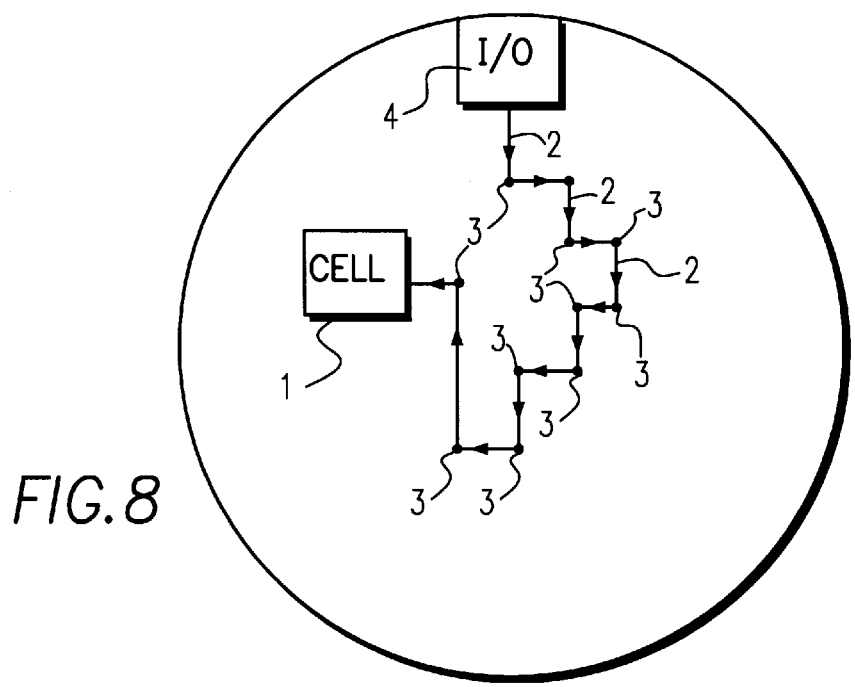
FIG. 8 shows schematically the progress of a message through a wafer scale integrated circuit in an embodiment of the invention.

In operation, if a single wafer scale device is directly connected to a processor, then on receipt of a memory address interrogation signal from the processor through the optical channel the port 4 decodes the address 90 in the route lookup table 80 and supplies a route header portion to the communication path 2a, followed by a message portion 60 comprising the interrogation signal and cell address 95. The message passes through the switches 3 in the device as indicated in FIG. 8, the header portion becoming progressively shorter at each switch 3, until the desired memory cell 1a is reached at which time the end of header flag 53 reaches the corresponding switch 3 causing the register 3e to route the memory interrogation signal to the memory cell 1a. At this time, all the switches 3 along the route through which the message has passed remain open, so that the channel between the port and the memory cell 1 is open.

The memory cell 1, in response to the interrogation signal, generates a corresponding block of memory data, as either a single word or a successive plurality of words which are supplied in sequence to the associated switch 3 and may thereafter be clocked back through the circuit to the port 4, to be parallel to serial converted in the converter 46 and transmitted back through the optical output channel via the electro-optical converter 48. The return message is terminated by an "end of message" flag word.

On detection of the "end of message" flag of the return message, each switch 3 through which the "end of message" flag passes then returns to a closed state.

Assembly of Wafer Scale Circuits

Figure 9:
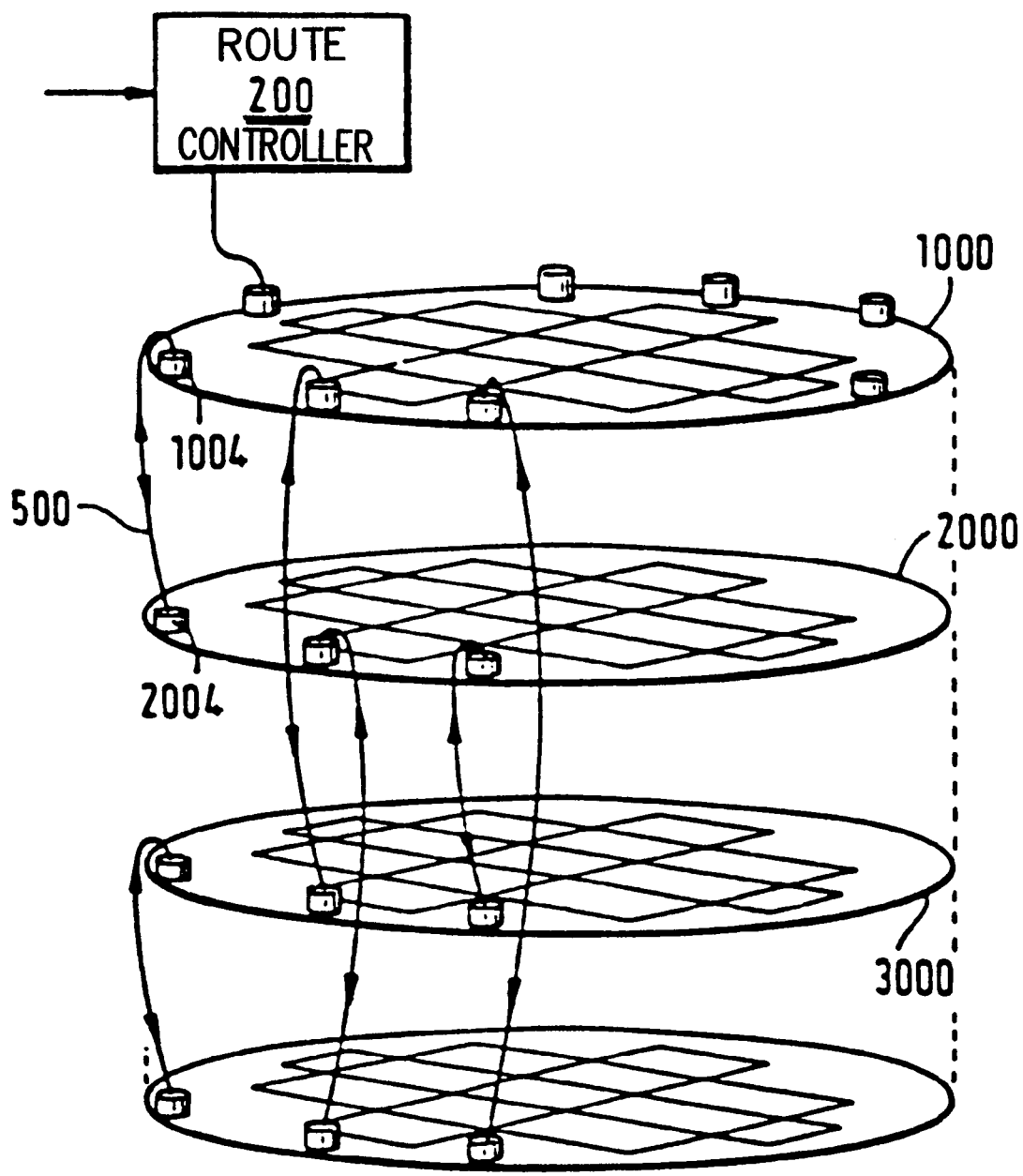
FIG. 9 shows schematically an array of wafer scale integrated circuits interconnected according to an embodiment of the invention.

A memory storage system comprising a plurality of devices of the type discussed above will now be described. Referring to FIG. 9, the system comprises a route controller 200, a plurality of wafer scale integrated circuits 1000, 2000, 3000 . . . , and a plurality of optical communication links 500 connecting ports of the integrated circuits 1000 etc..

The devices in this embodiment are mounted in a housing which aligns the wafer ports, and may be substantially light tight. Each link in this embodiment comprises two paths; one path for transmission in each direction.

Figure 10A:
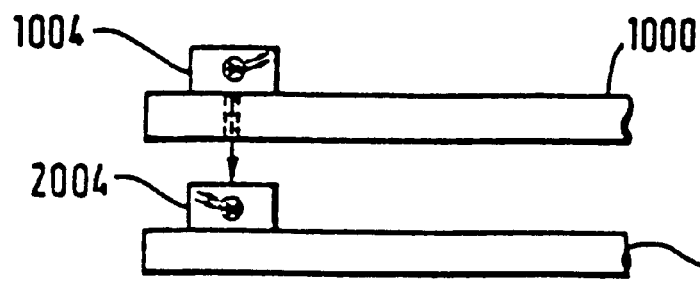
FIG. 10a–FIG. 10d show alternative methods of connecting the ports of the integrated circuits of FIG. 9.

FIG. 10a shows a first possible optical arrangement, in which a port 1004 comprises, as shown in FIG. 6, a photo emitter and photo receiver, as does a port 2004 on a device 2000. The device 1000 includes an aperture or hole produced, for example, by silicon machining or etching, above which the photo emitter of the port 1004 is bonded so that light from the photo emitter passes through the device 1004 and impinges upon the photo detector of the port 2004 of the device 2000 below. Accordingly, the air path to the device 1000 and the space between the two devices comprises the optical communication channel linking the two ports 1004, 2004.

Figure 10B:
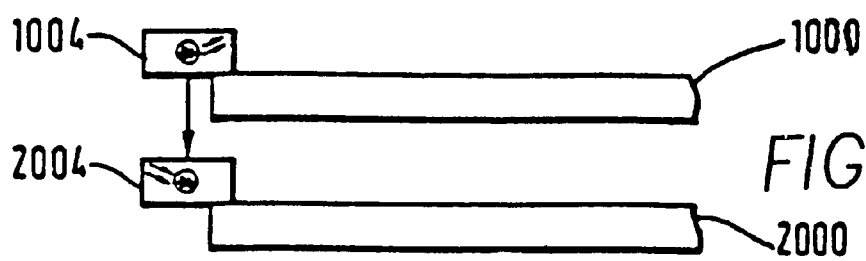

As shown in FIG. 10b, in an alternative arrangement the photo emitter and photo detector optical components making up the ports 1004, 2004 are mounted to the devices 1000, 2000 so as to overhang the edges thereof. It is therefore unnecessary to provide a hole in the devices as in the arrangement of FIG. 10a.

Figure 10C:
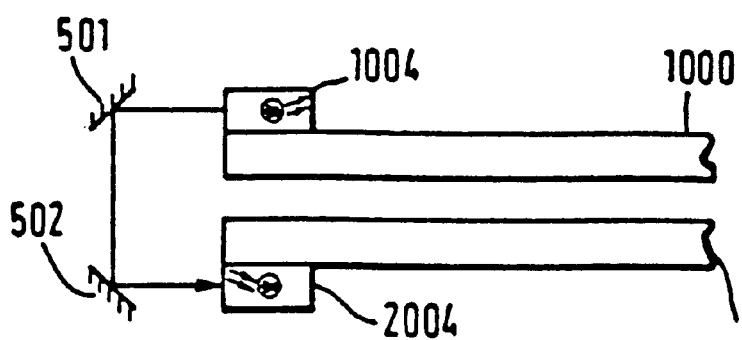

Referring to FIG. 10c, the photo emitter and photo detector components of the ports 1004, 2004 are arranged to be aligned outwardly of the devices 1000, 2000 and external optical reflectors 501, 502 are provided to define a path linking the two (as shown) (for example, a "periscope" arrangement).

Figure 10D:
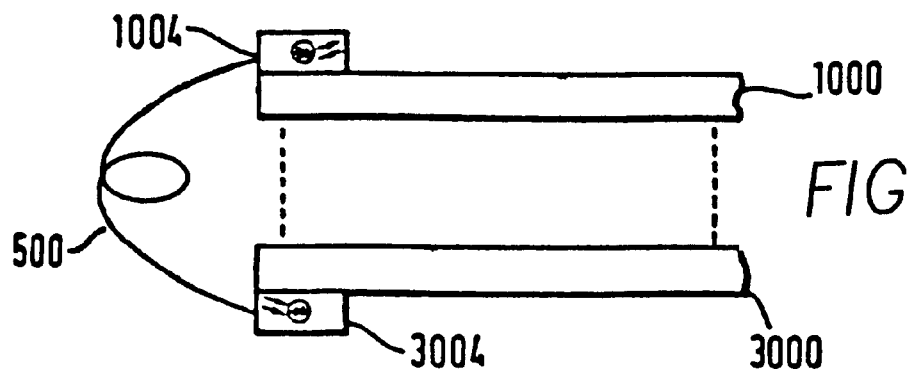

Referring to FIG. 10d, in an alternative arrangement, each detector and emitter may be coupled to an end of an optical fibre 500 interconnecting the two. In this arrangement, ports of devices which are not nearest neighbours can be directly intercoupled. This would also be possible with the arrangement of FIG. 10c, but more difficult since the optical components 501, 502 would need to be precisely positioned and adjusted.

Figure 11:
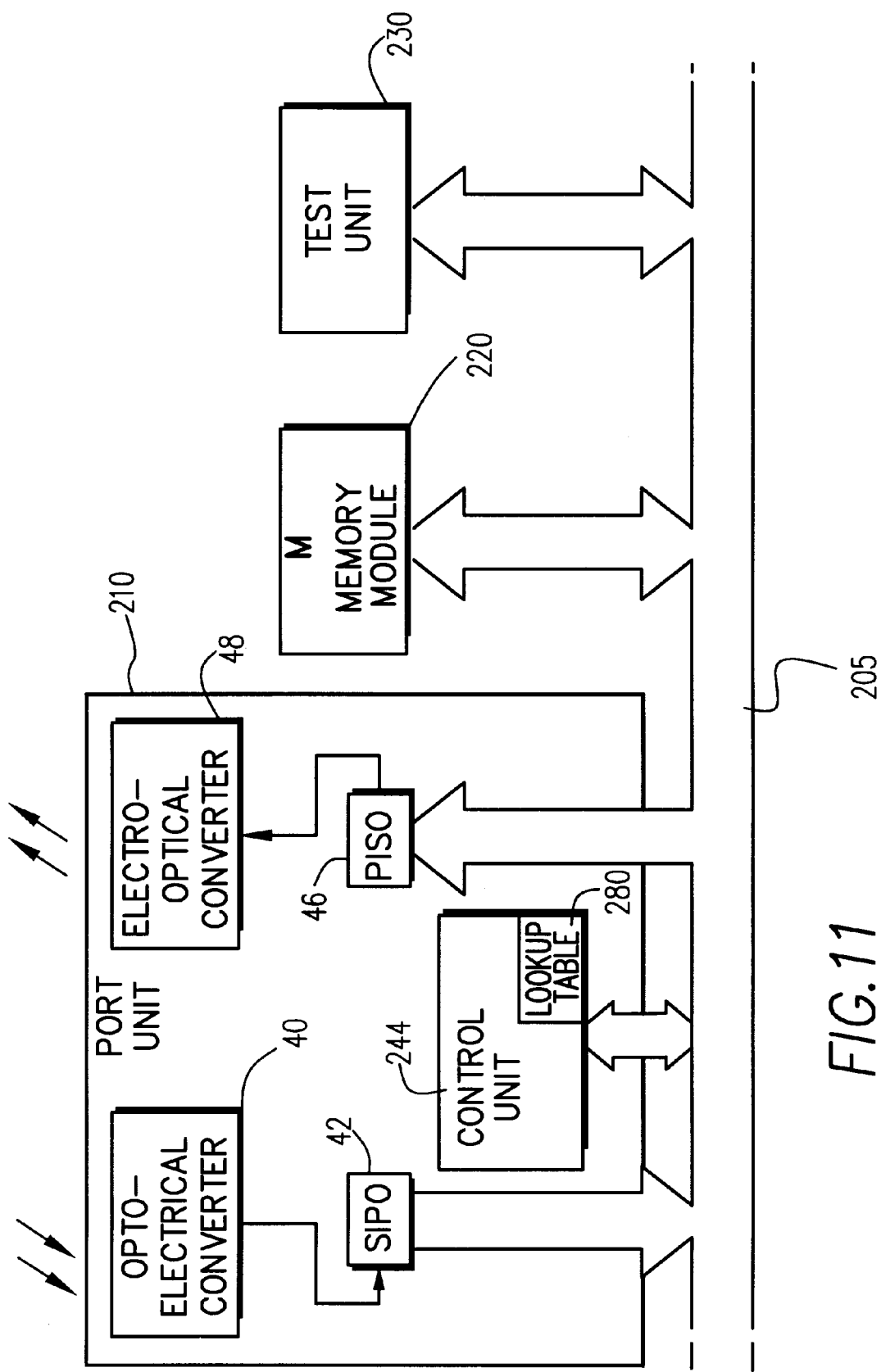
FIG. 11 shows schematically the elements of a controller forming part of FIG. 9.

Referring to FIG. 11, the control unit 200 comprises a port unit 210, which may be identical to the ports of FIG. 7 except that the control unit 244 controlling the port includes a lookup table 280 arranged to generate the port routing portion 85 for an incoming message.

Also provided at the control unit 200 are a memory module 220 and, in this embodiment, a test unit 230 for testing wafers and connection routes and for setting up the tables 280, 80. The parts of the control unit 200 are interconnected conveniently by a bus 205, and the processing or control circuit by which the memory device is to be used is likewise connected to this bus so as to write messages to the memory device control unit 200 or read messages therefrom.

Referring to FIGS. 12a–12d, the operation of the controller 200 will now be discussed in greater detail.

A message received at the system port 200 comprises a message portion 60 (for example comprising a block of data to be written to memory) and a virtual address portion 70 specifying the location to which the block is to be written in a form recognised by the processor or other equipment transmitting the message. The control unit 200 receives the virtual address portion 70 and looks up a corresponding route for reaching a block of memory to which that virtual address is allocated. The control circuit 200 deletes the virtual address portion 70, and substitutes a new header comprising an interwafer route portion 85 and a data block number 90. The interwafer portion 85 comprises a succession of port route instructions 81, 82, 83 . . . , terminated by an end of port code 84. The block number 90 will be used to generate the route header 50 of FIG. 5a on the wafer indicated by the last port in the port route portion 85.

The signal comprising the port route portion 85, block number 90 and message 60 is then transmitted serially to a first port P1 on a first device. The port P1 decodes and buffers the message, discards the first instruction and examines the second instruction which indicates another port on the same wafer device; the port indication P2 (word 82 of FIG. 12b) is employed to access the port route table 80 to derive a route across the wafer 1000 to the second port P2. As described above, the lookup table 80 provides a prefix 50 comprising the routing instructions to establish a connection across the first wafer; as shown in FIG. 12c, behind the prefix 50 is the remainder of the port route portion 85, and then the block address 90 and a message 60.

As described above, the message then proceeds incrementally cell by cell across the first wafer 1000 to the second port P2. At this port, the address portion 50 has been stripped away and the port therefore transmits the remainder of the port route portion 85, followed by the block address 90 and message 60.

This message then arrives at the next device 2000, which strips off the next word 82 in the port route header, looks up the address portion 50 to direct the message across the wafer 2000 to the next port P3 and transmits the message on. After crossing the wafer 2000, the message is then transmitted on to the next wafer through an optical channel and the next word 83 of the port route portion 80 is removed.

Finally, when the last word from the port route portion 80 has been removed, the port at which the message arrives looks up the block address 90 in the port lookup table 80 and provides a header 50 and address 95 to reach the corresponding cell, and memory segment within that cell, on the device. The message therefore opens up a channel to that cell across the device, and when the end of header bit 53 is encountered by a switch 3, the block of data is written to the desired memory segment at that switch 3.

The circuit across the wafers may be kept open, and an address message transmitted back from the memory cell through the open circuit to the control unit 200.

In one embodiment, where each wafer has 16 ports, each port flag 81, 82 . . . comprises a four bit code selecting a port. One code value (for example 00) may be used to indicate a message intended to create a local action at that port, rather than selecting a further port. Specific local actions will be discussed below.

In FIGS. 5a–5d and 12a–12d, the successive portions 81, 82 and 51, 52 are shown as separate successive parallel words. However, since as discussed above a two bit code is sufficient to switch each cell switch 3 and a four bit code is sufficient to select the next port at each port, a number of such successive codes 51, 52 or 81, 82 may be provided in parallel in a single multibit parallel word. For example, in one embodiment, parallel words within the wafer are 128 bits wide and an array of 256 cells are on the wafer. The longest path through the wafer, in an undamaged wafer, could be 32 steps long. Even allowing for damage to the wafer, the longest path length is not likely to exceed 60 steps, and thus it is possible to accommodate all the codes 51, 52 . . . making up the address portion 50 within a single parallel word. Each control means 12 is therefore arranged, on receipt of a digital word, to shift the word two bits, to bring the next instruction code on to the two bit lines to which the switch 3 is responsive, and for this purpose includes a shift register, or a bit shifting operation within a processor repertoire.

Likewise, the four bit port codes 81, 82 . . . within a port route portion 80 may be provided in parallel in a single word comprising a port route portion 80, and each port may include a four bit shifting circuit so as to shift the next four bits of the port routing word 80 on to the four bit positions to which the control unit 44 of the port is responsive. A single parallel word therefore permits routes including up to 32 ports; in other words, sufficient to traverse on the order of 30 wafers.

Error Correction Encoding

Because of process variations and imperfections, at various areas in the wafer bus lines or registers may be to some extent defective. For example, one bit line of a bus may be broken. To correct for one bit or two bit faults of this type, the controller 200 (or the apparatus through which the controller 200 is connected) may encode all messages in an error correcting code suitable for correcting the desired number of bits per word. In this instance, each 128 bit word is encoded, on a word-by-word basis.

The messages may also be block encoded by block error correction codes, by the controller 200 or by apparatus to which it is connected, to provide error correction or protection against larger scale memory defects.

Deriving Lookup Tables

Because each wafer may have different defects, the actual segment of memory on each wafer which corresponds to a virtual address supplied to the memory device will vary from wafer to wafer and the route across the wafer from a given port to each block of memory (and to other ports) will also vary from wafer to wafer. It is therefore desirable, for each wafer, to separately derive the port lookup tables. Methods of testing cells of a wafer are known in the art, e.g. from GB-A-2111627, GB-A-2114782, or EP-A-0172311, and could be employed for this purpose. For completeness, one method of testing will be given. The wafer could be tested after manufacture, or in situ.

Further, because the numbers of available blocks may vary from wafer to wafer, the wafer on which a segment corresponding to a virtual address supplied to the device is located may vary from system to system. Accordingly, it is also preferred to derive the contents of the lookup table 280 for each system, after the wafers have been tested. For this purpose, the tester 230 is arranged to test the device and program the wafers as will be described. The tester 230 may comprise, for example, a microprocessor connectable to the port 210.

To enable testing, the following local operations within each port and memory cell are provided:

1. Port

A. On receiving a "local operation" code followed by a code "00" for example, the decoded message received by the port in the register 42 is routed to the register 46 and transmitted back. This therefore provides a check of the functioning of the optoelectronic components and coding/decoding components of the port.

B. When the local operation code is followed by a code "01", for example, the port control unit 44 is arranged to read the contents of the route table 80 into the register 46 for transmission back to the orgination of the request.

C. On receipt of the local operation code followed by a "10" signal, for example, the port is arranged to write the following data into the route table 80, to overwrite the existing table contents.

2. Cell

A. On receipt of the "local operation" word followed by a code "00", the cell is arranged to route the following data back to its origin ("loopback").

B. On receipt of the "local" code followed by "10", the control unit 12 is arranged to write the following block of information to a location in memory and then in a cell.

C. On receipt of the code "01", the controller 12 is arranged to cause a block of memory at a specified address to readout its contents on to the bus.

The tester 230 tests each port for correct operation by writing a block of data through the port and then reading a block of data back. The communications path 2 and memory units 10 on each wafer also need to be tested for correct operation. Having determined which blocks are working and accessible, the tester 230 then allocates to each possible virtual address receivable by the device a corresponding block on a wafer, and programs the tables 80 in the ports on the wafers and the table 280 in the controller 200 accordingly.

The wafer testing comprises a first stage in which the paths are tested, and a second stage in which the memory segments within each cell are tested.

The first stage comprises a first test in which a message is sent to a cell merely comprising a "local operation" word for that cell followed by a loopback code 00 followed by a test word. If the cell is functioning correctly, the test word is returned to the port. It would be possible for the test word to be returned to the port correctly even if some bit errors were present on a line (for example if a line were permanently high or permanently low). Accordingly, a second test comprises sending a similar test message but with a plurality of test words having one's and zero's in different bit positions in each word; if all the test words are returned correctly, the buses and registers for the cell under test are working correctly.

Figure 13:
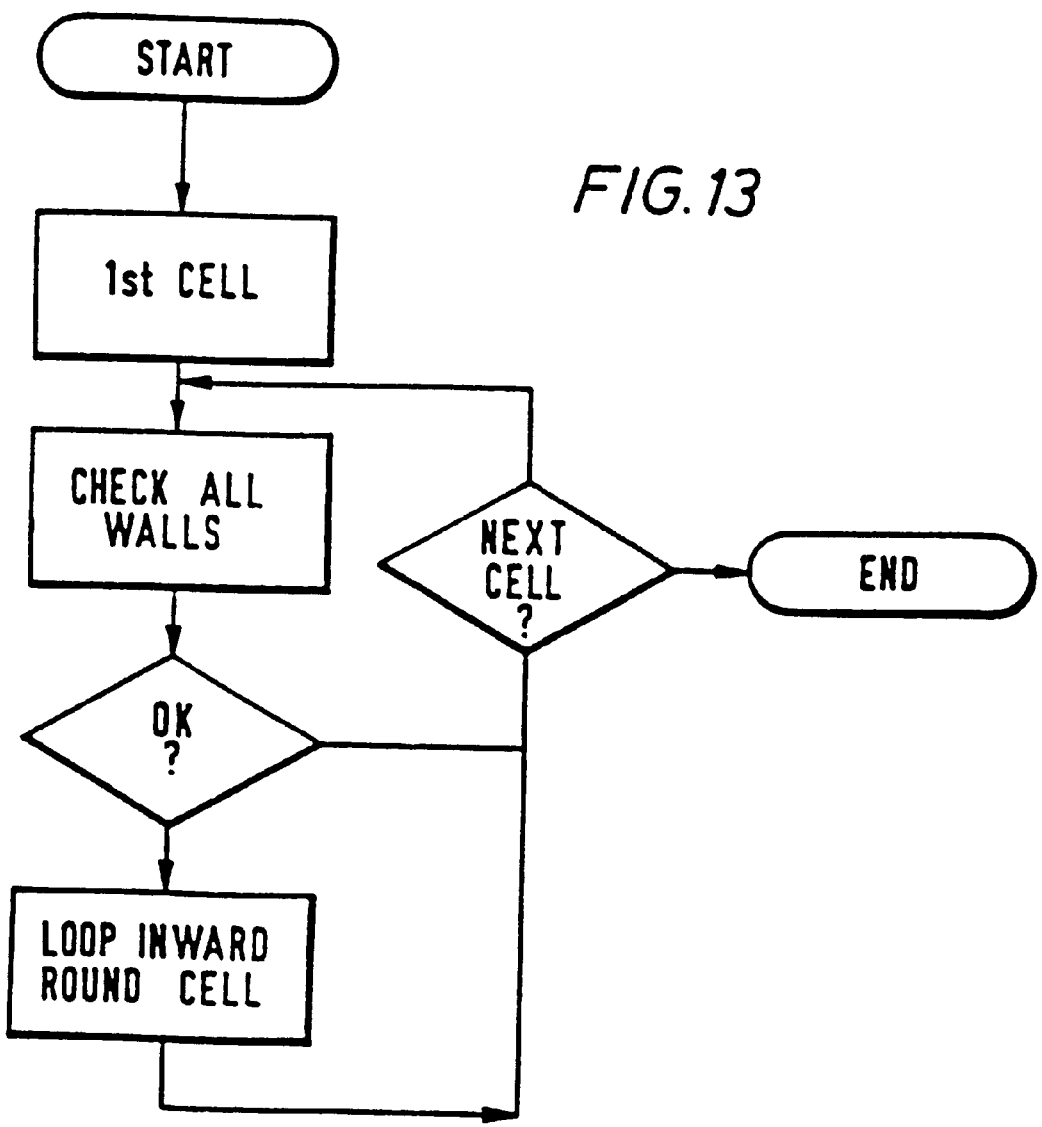
FIG. 13 shows schematically a test routine for testing communication paths on a wafer.

In greater detail, as shown in FIG. 13, to test a wafer the tester 230 generates a test signal comprising the "local operation word" followed by a loopback code followed by a test word and supplies it to a first port. If the bus 2, register 3a and control unit 12 of the cell nearest to the port are working correctly, the message word is received back at the port from the cell. Next, the next test message is generated comprising the same sequence but with a switching command prefix 01, 10 or 11. For example, the code 10 may indicate the selection of the leftmost register 3b of the cell nearest the port. If that cell is working correctly, the initial code is stripped from the message which is passed to the next cell on the left. Since that cell receives the "loopback" message, the test message is passed back to the first cell and thence to the port.

The same process is repeated for each of the other two neighbouring cells. If all four tests are successful, the first cell nearest the port is operating correctly.

Figure 14:
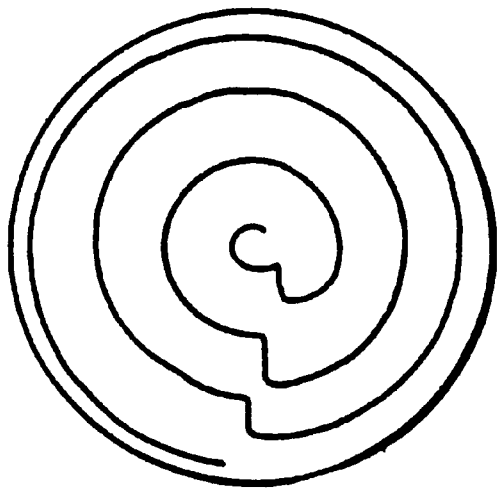
FIG. 14 shows schematically the progress of the test routine through the wafer.

Next, a test message is generated for the next cell leftwards of the first cell; the four messages necessary to test the four registers of the second cell are the same as those of the first cell but with an additional 01 prefixed to switch the messages through the first cell to the second. As the ports are, in this embodiment, provided at the edge of the wafer the first memory cell tested is at the edge of the wafer and so is the next cell to its left. After testing the second cell, the third cell around the wafer edge is tested; if there is no connection to the left of a cell, the next cell tested is ahead and if this is not possible, the next cell tested is to the right. By continually selecting the leftmost available path, the test procedure extends around the periphery of the wafer clockwise, as shown in FIG. 14. When a defective cell register is encountered, the other registers of the cell are tested and by selecting the next leftmost cell edge (straight ahead or to the right) the test procedure travels inwardly of the wafer to bypass the defective register and then outward again.

On testing all cells round the periphery of the wafer, the cells immediately inward of the periphery cells are then tested, until the centre of the wafer is reached via a spiral path.

After completion of this test procedure, the list of the successive registers tested and the results of each test provide a map of the path and register defects of the wafer. Further, the path taken by the test provides, for each working cell, a spiral route through the wafer defined by the test message header portion used to reach that cell.

The second test is then executed to determine to what extent the memory within each cell functions. For example, in a storage system, data may be written to memory in data blocks of on the order of 1Kbyte. Accordingly, working segments of each memory module 10 of each cell 1 which are larger than 1Kbyte may be used for storage. Each working cell (that is each cell with at least one working register 3a–d) is first written with a block of test data at one address range, and then interrogated by the port. The data read back from the memory is compared with the test data. A second, bit reversed, block of test data may also be transmitted to the same segment of memory, to ensure that no individual bit lines are faulty.

The test is repeated for each segment memory within each of the memory modules 10 within each cell 1, and for each cell the addresses 95 of working segments recorded.

After the second test, data is thus available which defines, on the wafer, the addresses within cells of working memory segments and the locations of working paths and registers. From this information, the tester 230 can readily calculate relatively short routes from each port to each cell. Likewise, relatively direct routes from each port to each other port are calculated. These data are then programmed into each port, by transmitting a "local operation" code to each port followed by a "write table" code followed by the contents of the port table as derived.

For each segment, an entry is thus provided in the port table 80 comprising the header 50 to reach the cell on which that segment is located followed by the address 60 within the cell of the segment.

Subsequently, when a plurality of tested wafers are assembled into a system shown in FIG. 9, the tester 230 tests each port, by writing a block of data through the port and then reading a block of data back. The tester 230 is arranged to interrogate each port in turn to read its table 80. The nearest port is read first, and then the succeeding ports on the same device as the first are read by applying the same interrogation signal with a four bit port selection code prefixed, and then the ports of the next device are likewise interrogated until the tester 230 has read all the tables 80 from all the ports. From inspection of the size of the tables for each device, the tester 230 can determine the number of usable data segments on each device. For each possible virtual address value, to which the system is to be responsive, the tester 230 selects one of the available segments and stores in the table 280 a port route portion comprising the sequence of ports required to reach the port on the wafer at which that segment is and the block address 90 within the table 80 at that port which corresponds to the segment. Thus, the block address 90 provides the index used to access the port table 80.

If a wafer is removed from the system, a new wafer can be substituted provided that ports on the new wafer corresponding to working ports on the old wafer also work, and that the new wafer has at least as many operating segments as are used on the old wafer. Information on the physical location of defective components is thus localised within the port tables 80, enabling wafers to be interchanged.

If the average rate of defective components is well chaacterised, the maximum number of working segments used per wafer may be selected so that each wafer employed is likely to have in excess of this number of working cells and segments. Accordingly, in an assembly of wafers, even if perhaps one wafer has less than the necessary number of working segments, extra segments will be available on the other wafers. Conveniently, the tables 80 may be derived on testing after manufacture of each wafer; any wafer with more than a predetermined number of defects may be not used. Likewise, the wafers may be classified by the number of working segments available.

The tester 230 may be arranged periodically to repeat the tests of wafers and ports and, if necessary, to rederive the tables 80, to 280 accordingly, to take account of deterioration of components. For example, a test may be performed at each time the apparatus is switched on. The tables may therefore be held in writable memory; e.g. electrically programmable ROM.

Preferred Embodiment

Figure 5B:
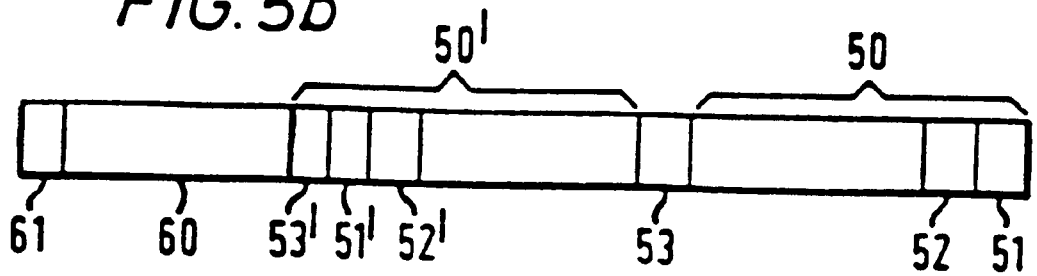
FIGS. 5b–5e show further messages communicating within the arrangement of FIG. 1 in different embodiments.
Figure 5C:
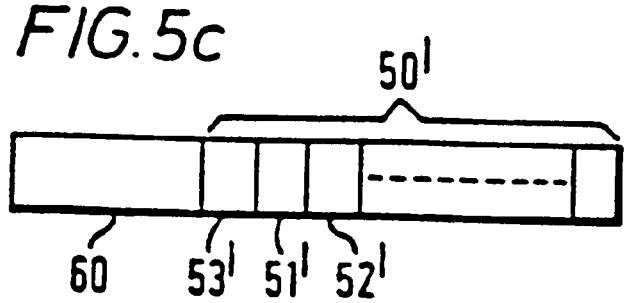

In the above described embodiments, the circuit is kept open until the return message has been received by the port from which the request originated. In a preferred embodiment, the bandwidth available within the or each wafer is increased by dissolving the circuit after a transmitted message has been received, and then reestablishing a path for the acknowledgement or reply message. This is achieved by providing, as shown in FIG. 5b, an inverse header portion 50' following the header portion 50. In the inverse header portion, the code 51' corresponds to the code 51, so that the inverse header portion 50' retraces the route backwards followed by the header 50. In this embodiment, on receipt of a message by a cell for which it is intended, the end of header flag 53 is recognised. The inverse header, including the "end of inverse header" flag 53' is then stored in a buffer store in the control unit 12, and the message 60 is routed to the cell. Any necessary local action is performed, and then a return message (either an acknowledgement word or returning data) is prepared within the cell 1. The inverse header 53' is prefixed to the return message, and acts as a header 50 guiding the return message 60', as shown in FIG. 5c, back to the port whence it originated.

As in the above described embodiment, the header 50 may comprise a single parallel word as may the return header 50'.

Figure 5D:
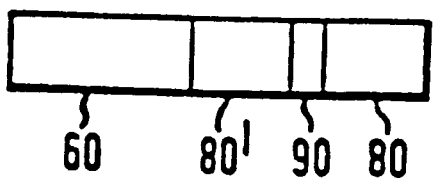
Figure 5E:
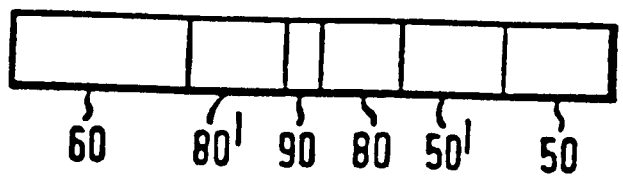

Similarly, the controller 200 may append, behind the port routing portion 85, an inverse port routing portion 85' which is treated as part of the message 60 by the ports as the message is forwarded to its destination, and is buffered at the destination cell together with the inverse header 50'. Thus, on the return path, a message reaching port from whence it came is forwarded to the port on the preceding wafer through which the message arrived, and is then transmitted across that wafer to the port indicated in the inverse route portion 80' across the wafer, from which it had previously come. For example, a 4 bit port code 81 may indicate, rotating round the wafer clockwise, the number of the next port (1–15) relative to the present port; the reverse code 81' is then given by 16-(81). The format of a message in this embodiment generated by a controller 200 is illustrated in FIG. 5d, and the format of such a message upon reaching a wafer is illustrated in FIG. 5e. To sum up, in this embodiment each port table is arranged to generate, as an output of the lookup table 80, a header which comprises a forward header portion 50 for routing the following message across the wafer to a destination, and a reverse or inverse header portion 50' for routing a return message an identical route back across the wafer to the port, and the device controller 200 is arranged to generate, at an output of a lookup table 280, a prefix comprising a routing header portion 80 for routing the message to a succession of ports and an inverse route header portion 80' for retracing the route back through the ports through the controller 200.

If, as described above, only a single controller 200 is present then rather than provide the reverse header portion 80' it would be possible for each port to retain a "return to controller" sequence of port codes 80'.

Shared Access Storage System

In a system illustrated in FIG. 9, a single control unit 200 is provided connectable to an outside device such as a data processor.

Figure 15:
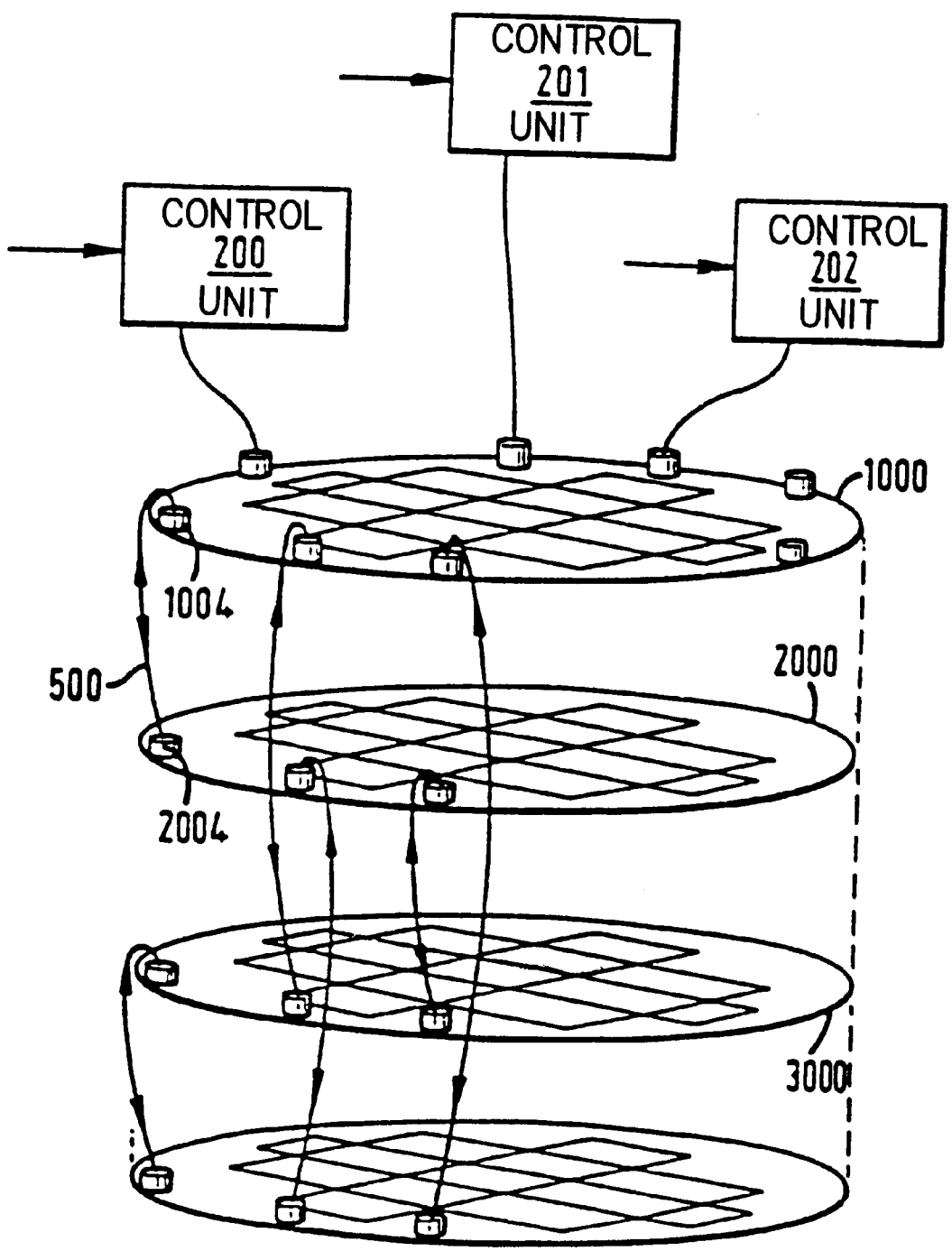
FIG. 15 illustrates a further embodiment of the invention providing a memory device for shared access.

However, in this embodiment, referring to FIG. 15, a plurality of different control units 200, 201, 202 are provided each connected to a different port. The controllers 200–202 are similar, but the contents of the tables 280 differ from port to port since the starting ports are different. Each of the controllers 200–202 is connectable to an external processor (not shown). Simultaneous access to the memory system is therefore available.

Hierarchical Memory System

Figure 16:
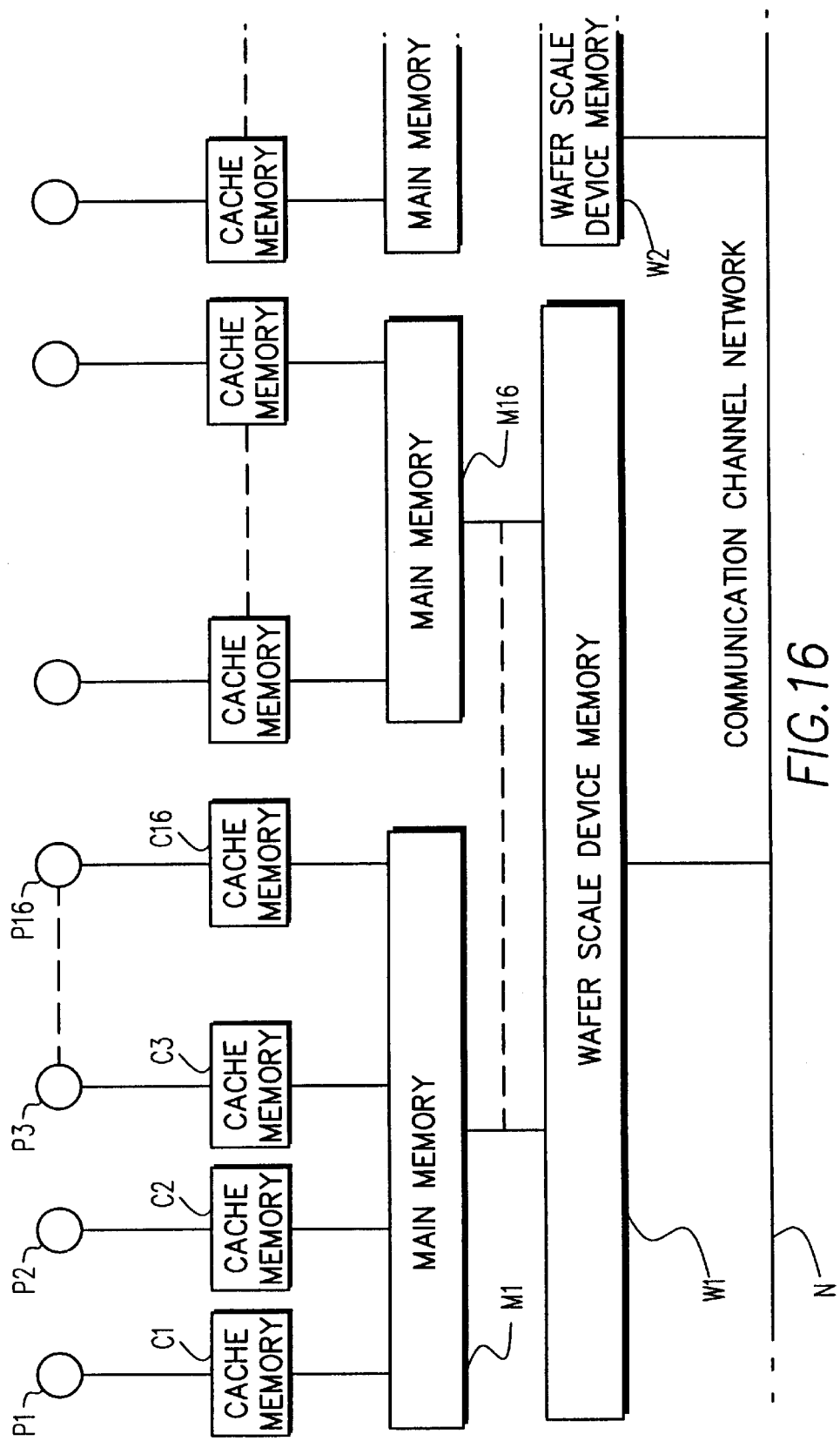
FIG. 16 ilustrates a further embodiment of the invention providing a hierarchical memory structure.

Referring to FIG. 16, a particularly preferred application of the invention is in a hierarchical memory structure. A hierarchical memory structure comprises a small, fast memory unit (cache) in which data accessed most frequently by the processor is stored, and at least one larger slower memory unit in which data accessed less frequently is stored. A memory controller monitors the frequency of the usage of the stored data and transfers data between the memory so that frequently used data is in the fast memory to the extent possible.

At present, a typical known hierarchical memory arrangement comprises a small, expensive, cache memory comprising a static RAM; a larger, slower, cheaper memory comprising dynamic RAM (DRAM) and a mass storage memory device such as a disc drive.

A memory device according to any of the preceding embodiments may be more cheaply manufactured than the conventional memory chips, because the same components can be fabricated on a wafer but the expense of cutting and packaging the components is avoided. However, because the memory is accessed via a multistage switched path, rather than directly from a bus, the average access time or latency is greater. Thus, a wafer scale memory is suitable to provide a third layer of semiconductor memory, slower than separately packaged RAM devices but considerably cheaper.

It is also known to provide a plurality of processors sharing a memory structure, for example for parallel processing of common data. In this case, as shown schematically in FIG. 16, each processor is provided with local cache memory for its own use. Conventionally, a limited number of processors share a slower main semiconductor memory area, which is in turn connected to a communications network, interconnecting the main memories of several such clusters of processors. In use, data required by the processor is first searched for in the cache memory; if it is not there, the main memory for that cluster of processors is accessed. If it is not within the main memory, the communications network is accessed for example to search the main memories of other clusters of processors, or common storage devices. The communications layer is expensive, complex, and of limited connectivity.

The number of processors forming the cluster linked to each main memory unit is limited by the traffic to the cluster main memory, and for this reason, typically each main memory unit can only support around 16 processors.

According to this embodiment of the invention, as shown in FIG. 16, main memory units are interconnected to different controllers 200–202 etc of a wafer scale storage device as shown in FIG. 15. The wafer scale memory provides relatively rapid storage (compared to the communications network), and additionally the use of separate controllers 200–202 permits data to be routed through the device from one controller to another controller; thus, a request for data which is not in the wafer scale memory system can be routed through the system and out through other control units 201–202 to other main memory units in turn. The wafer scale memory unit therefore acts firstly as a lower speed bulk store and secondly as a communication network between the memory units connected to its controllers.

In FIG. 16, each processor P may be for example an MIPS R4000 processor connected via its bus to a cache memory C comprising, for example, one megabyte of static RAM. The cache memories C of several (e.g. 16) processors are connected via the system bus to a main memory M comprising, for example, 32 megabytes of dynamic RAM (DRAM). Several main memories M are interconnected via the wafer scale device memory W according to the above embodiments via a fiber optic connector, employing for example the FIBERChannel Protocol Standard proposed by IBM. A conventional memory management unit arranges the interchange of data between the cache memory C and the main memory M, based on demand for particular blocks of data and availability of storage space in each memory. Likewise, the control unit 200 performs memory management between the main memory and the wafer disc memory, in a similar manner.

A plurality of such multiprocessor/cache/main memory/wafer scale storage devices may be interconnected through a communications network N, to enable access between a large number of processors. Alternatively, a common archive storage unit may be used.

In such a system, the memory management circuitry is arranged to search first the cache memory, then the main memory, then the wafer scale device memory and ultimately the external communications network. If data is located within the wafer scale device, the data block is read out to the main memory requesting the data. From there it is passed back to the processor which initiated the request for data. If data is not present within the wafer scale device, the block of data is obtained from a communications network. To enable more rapid access in future, the block of data is preferably written to an address in the wafer scale memory device, and to preserve data the existing contents of that memory block are first transmitted down to the communication network for storage (e.g. on an archive disc drive).

At lower and therefore slower levels of the hierarchy the blocks in which data is transferred are correspondingly larger.

Other Embodiments

In the above described embodiment, the use of wafer scale circuits which provide both memory and communications routing is highly effective since the communications routing enables the interconnection of a large number of clusters of processors at low cost and with low connection delay. The cost of the interconnection of clusters of the processors increases only linearly with the number of such clusters, because of the higher communications capacity of the wafers, rather than as the square of the number which would be the case of the prior art.

Further, because the wafers are connectable as in FIG. 10e through fiber optic connectors, the wafers making up the device may be widely dispersed. This can provide considerable resilience to localised accidents such as loss of power, fires or flood.

It is convenient to provide 16 ports for each wafer, or in general a number of ports which is a power of two, as this permits large, regular, highly connected networks (such as hyper cube structures) to be set up with multiple paths from port to port to provide reduced prospect of message conflict and hence increase the bandwidth. This also reduces the average number of steps to cross the network (e.g. the diameter of the network).

Rather than provide tables 80 at each port, it would be possible for the system controller 200 to provide a route header which included a header portion 50 for each wafer to the destination cell; in this embodiment the system controller table 280 contains equivalent information to that of the port tables 80 in the above embodiments. However, this increases the necessary length of messages. It also makes interchanging wafers more difficult as defect information is no longer concentrated in each wafer. It would alternatively be possible to provide a table at each cell 1 equivalent to the system controller table 280, so that each message need contain no routing instructions and each cell can make an independent routing decision. However, this considerably increases the complexity required at every cell. Also, on interchanging a wafer, every cell of every other wafer would also need to be reprogrammed. Thus, preferably, information on routing on each wafer is located at, and supplied from, a limited number of sites (e.g. ports) on that wafer as in the above described embodiments.

Although circuits including memory have been described, it will be clear that the wafer scale integrated circuit according to the described embodiments could merely be employed to provide a switching array, for routing a signal arriving at any one port to any one of the other ports on a wafer. Since it is envisaged to provide 16, or more, ports per wafer, for example, a large connectivity switch can be provided by providing an assembly of several wafers. Such a switch has a high bandwidth, and could be used for as a communications or network switch even if the wafers included no memory. However, the ready availability of substantial memory within the switch may be utilised to advantage, for example in message buffering or switch control. Likewise, it is possible to provide other circuitry than memory on each wafer; for example, an array of processors. In application as a network switch, the invention also advantageously permits physical dispersal of the wafers (e.g. to provide a wide area network), with optical fiber interconnection between them.

As described above, an assembly of devices may be interconnected by considerable lengths of optical fiber running between ports of different wafers, so that the wafers can be physically dispersed rather than localised in a single housing.

Although in the above described embodiments the ports have been shown as being placed at the edge of the wafer, it would be possible to position the ports elsewhere on the wafer. However, the edge of the wafer is a convenient location firstly from the point of view of ease of connection to optical fibers and secondly because cells 1b at the edge of the wafer are not connected on all four sides and can hence be employed to receive data from a port readily.

Although interconnection between an assembly of circuits has been described in which one-to-one links between wafers are employed, it might also be possible to interconnect a plurality of wafers via a bus structure.

In the foregoing, the term "wafer scale" does not, of course, imply that the entire wafer disc needs to be present; a substantial part or division of the wafer is likewise encompassed in the term.

In this document, "optical" includes non-visible electromagnetic radiation (e.g. infra-red wavelengths).

I claim:

1. A multiway signal switching device comprising:
   a wafer scale integrated electrical circuit having thereon a plurality of optical input and output communication ports having opto-electric and electro-optic transducers respectively,
   the wafer scale integrated circuit comprising:
   a tessellated array of integrated circuit modules dispersed over substantially an entire undiced semiconductor process wafer present during integrated circuit manufacture,
   some of said modules being inoperable as a result of defects in manufacture of portions of the integral wafer scale circuit, and each of said modules being connected on the wafer scale circuit with a plurality of switched parallel bit digital signal paths selectively interconnecting a desired two of said ports to route high bandwidth information carried by a digital optical signal therebetween while in the electrical domain so as to pass an optical input signal at an input port to an optical output signal at an output port including substantially the same high bandwidth information as input while avoiding inoperable modules.

2. A device as in claim 1 comprising:

a plurality of communication paths between said modules, the switched digital signal paths being coupled to the communication paths and interconnecting a first path and a selected second path, and a switch control connected to said switched digital signal paths opening a circuit path following a route from a said first port through said wafer and to a selected said second port different from the first.

3. A device as in claim 2, in which the switch control comprise switch control means located at each switched digital signal path and responsive to signals received thereat.

4. A device as in claim 3 arranged to carry messages over said circuit, said messages comprising a message portion corresponding to said external signal and a routing portion comprising a plurality of switch instruction portions, and each switching means including means for reading a successive one of said switch instruction portions and for coupling a first path to a second path selected in response thereto.

5. A device as in claim 4 in which a message may be addressed to a module of the device, a said message comprising a switch instruction portion to which a switching means is arranged to respond by supplying the message portion into a neighbouring module.

6. A device as in claim 4 in which the message includes a return routing portion having a plurality of return switch instruction portions and in which each switching means includes means for reading said return switch instruction portions in reverse order to said switch instruction portions.

7. A device as in claim 4 in which the control means further includes route control means located on the device, for generating said routing portion.

8. A device as in claim 7 in which the route control means includes means for storing a lookup table of routing portions for corresponding destinations on the device.

9. A device as in claim 8 in which the lookup table store means is rewritable.

10. A device as in claim 7 in which the route control means is located at a port.

11. A device as in claim 2 in which the control means and the switching means defining the route are arranged to disconnect said circuit path after passage of a signal therealong, and are arranged to reopen the circuit path thereafter to pass a return signal to the originating first port.

12. A device as in claim 1 in which each signal routed through said circuit includes a plurality of successive message units.

13. A device as in claim 2, in which each path includes a plurality of parallel bit paths, and each signal routed through said circuit includes a plurality of successive message units each of which includes a parallel data word.

14. A device as in claim 13 in which the switching means includes parallel register means disposed between the parallel bit paths of adjacent modules, to switch a parallel word from one path to that of an adjacent module.

15. A device as in claim 2 in which the modules include memory circuits.

16. A wafer scale integrated circuit assembly comprising:

a plurality of wafer scale integrated circuit devices according to claim 1, and means defining at least one optical path between a communication port of a first said device and a second said device.

17. An assembly as in claim 16 in which the optical path includes an air path.

18. An assembly as in claim 16 in which the optical path means include an optical fibre.

19. An assembly as in claim 16 further comprising;

assembly control means for interconnecting said assembly to an external device, said control means being arranged to selectively communicate with a second said wafer scale device via a first said wafer scale device.

20. An assembly as in claim 19, in which the assembly control means is arranged to accept a signal from said external device and to generate a message including:

a message portion corresponding to said signal from said external device, and an assembly routing portion including a plurality of port instruction portions corresponding to the ports defining the route through the assembly taken by the message.

21. An assembly as in claim 20 in which each port is responsive to a said port instruction portion to generate a routing portion including a plurality of switch instruction portions for setting each switching means along a route across the wafer between the port and the next port specified by the port instruction portion.

22. A data processor comprising:

a plurality of processing units included in respectively corresponding modules interconnected via different ports of a device according to claim 1.

23. A processor as in claim 22 in which:

each processing unit is provided with a relatively fast memory, and said relatively fast memories are interconnected via said device or assembly.

24. A processor as in claim 22 in which said device or assembly is interconnected with other devices or assemblies via a communications channel.

25. A hierarchical memory system for a plurality of processors separate of, and interconnected to communicate data from a first said processor to a second said processor through a wafer scale integrated circuit memory device comprising:

a tessellated array of integrated circuit memory modules dispersed over substantially an entire undiced semiconductor process wafer present during integrated circuit manufacture some of said modules being inoperable as a result of defects in manufacture of portions of the integral wafer scale circuit, and each of said modules being connectable on the wafer scale circuit to a plurality of parallel bit digital signal paths for by-passing and avoiding inoperable ones of said modules.

26. A system as in claim 25 in which each processor is connected to a first memory unit having a lower latency than said wafer scale integrated circuit device.

27. A system as in claim 26 in which:

each processor is connected to a first, relatively high speed memory, a plurality of said first memories are connected to a second, slower, memory having a lower latency than said integrated circuit device, and a plurality of said second memories are interconnected via said wafer scale integrated circuit device.

28. A system as in claim 25 in which the connections to said wafer scale device or devices are via optical links.

29. A system as in claim 25 in which the wafer scale integrated circuit memory device is connected to a mass storage disk device.

30. A wide area network comprising:

a plurality of wafer scale integrated circuit devices according to claim 1, physically dispersed at different geographical locations and interconnected by optical fibres.

31. A data processor comprising a plurality of processing units interconnected via different ports of an assembly according to claim 16.

32. A multiway signal switching device comprising:

a wafer scale integrated circuit in a substrate including a plurality of electrical circuit cells dispersed over substantially an entire integrated circuit integrally processed wafer during integrated circuit fabrication, some of said cells being inoperable due to manufacturing defects, and including a plurality of electrical communication paths between the circuit cells;

a plurality of electrical switches coupled to the communication paths and interconnecting a first said path and a selected second said path;

at least one optical communications port connected to a said electrical circuit cell receiving an optical signal and converting said optical signal into an electrical signal, at least one optical output communications port connected to a said electrical circuit cell to receive an electrical signal therefrom and convert said electrical signal into an output optical signal; and control means for controlling said switching means to open a circuit path following a route from a said input port through said circuit and to a selected said output port so as to pass an externally input optical signal through the electrical domain circuit to an optical output communications port without loss of optical signal information content being thus switched through the device.

* * * * *